United States Patent
Chung et al.

(10) Patent No.: US 10,147,828 B2
(45) Date of Patent: Dec. 4, 2018

(54) SOLAR CELL AND METHOD FOR MANUFACTURING THE SAME

(71) Applicant: LG Electronics Inc., Seoul (KR)

(72) Inventors: Indo Chung, Seoul (KR); Taehee Shin, Seoul (KR); Ilhyoung Jung, Seoul (KR); Jinah Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 33 days.

(21) Appl. No.: 15/198,212

(22) Filed: Jun. 30, 2016

(65) Prior Publication Data

US 2016/0380138 A1 Dec. 29, 2016

Related U.S. Application Data

(62) Division of application No. 13/886,813, filed on May 3, 2013, now Pat. No. 9,412,888.

(30) Foreign Application Priority Data

May 7, 2012 (KR) ........................ 10-2012-0048179

(51) Int. Cl.
  *H01L 31/0352* (2006.01)
  *H01L 31/068* (2012.01)
  *H01L 31/18* (2006.01)

(52) U.S. Cl.
  CPC .... *H01L 31/035272* (2013.01); *H01L 31/068* (2013.01); *H01L 31/1804* (2013.01);
  (Continued)

(58) Field of Classification Search
  CPC ............... H01L 31/068; H01L 31/1804; H01L 31/035272
  See application file for complete search history.

(56) References Cited

U.S. PATENT DOCUMENTS 6,091,021 A  7/2000  Ruby
6,147,297 A  11/2000  Wettling
(Continued)

FOREIGN PATENT DOCUMENTS

CN  101884115 A  11/2010
JP  04-356972 A  12/1992
(Continued)

OTHER PUBLICATIONS

JP 04-356972 A English Translation, Dec. 10, 1992.*
(Continued)

*Primary Examiner* — Golam Mowla
(74) *Attorney, Agent, or Firm* — Dentons US LLP

(57) ABSTRACT

A solar cell includes a semiconductor substrate having a first conductivity type, an emitter layer on a surface of the semiconductor substrate, the emitter layer having a second conductivity type different from the first conductivity type, and electrodes including a first electrode electrically connected to the emitter layer, and a second electrode electrically connected to the semiconductor substrate. The emitter layer includes a high-concentration doping portion adjacent to the first electrode, and a low-concentration doping portion in a region that does not include the high-concentration doping portion. The low-concentration doping portion has a higher resistance than the high-concentration doping portion. The high-concentration doping portion includes a first region having a first resistance, and a second region having a second resistance higher than the first resistance.

10 Claims, 8 Drawing Sheets

(52) U.S. Cl.
CPC ........ *H01L 31/1864* (2013.01); *Y02E 10/547* (2013.01); *Y02P 70/521* (2015.11)

(56) References Cited

U.S. PATENT DOCUMENTS

| | | |
|---|---|---|
| 6,429,037 B1 | 8/2002 | Wenham |
| 6,695,903 B1 | 2/2004 | Kubelbeck |
| 7,615,393 B1 | 11/2009 | Shah |
| 7,851,696 B2 | 12/2010 | Mueller |
| 8,012,531 B2 | 9/2011 | Kim |
| 8,071,418 B2 | 12/2011 | Rohatgi |
| 8,367,924 B2 | 2/2013 | Borden |
| 8,664,015 B2 | 3/2014 | Park |
| 2009/0288704 A1 | 11/2009 | Borden |
| 2011/0186116 A1 | 8/2011 | Kruemberg et al. |
| 2011/0253209 A1* | 10/2011 | You ................... H01L 31/02243 136/255 |
| 2012/0048376 A1 | 3/2012 | Gilman |
| 2012/0312367 A1 | 12/2012 | Jin et al. |
| 2013/0056051 A1 | 3/2013 | Jin et al. |
| 2013/0298975 A1 | 11/2013 | Yang et al. |

FOREIGN PATENT DOCUMENTS

| | | |
|---|---|---|
| JP | 2011512041 A | 4/2011 |
| WO | 2006/117975 A1 | 11/2006 |

OTHER PUBLICATIONS

English translation of Chinese Office Action dated Jun. 21, 2016 corresponding to Japanese Patent Application No. 201310164677.4, 5 pages.

\* cited by examiner

SOLAR CELL AND METHOD FOR MANUFACTURING THE SAME

CROSS-REFERENCE TO RELATED APPLICATION

This application is a Divisional application of U.S. patent application Ser. No. 13/886,813 filed on May 3, 2013, which claims the priority benefit of Korean Patent Application No. 10-2012-0048179, filed on May 7, 2012 in the Korean Intellectual Property Office, the disclosure of which is incorporated herein by reference.

BACKGROUND

1. Field of the Disclosure

The present disclosure relates to a solar cell and a method for manufacturing the same, and more particularly to a solar cell including an impurity layer and a method for manufacturing the same.

2. Description of the Related Art

Recently, as existing energy resources such as petroleum and coal are being depleted, interest in alternative energy sources is increasing. In particular, a solar cell which directly converts solar energy into electric energy is highlighted as a net-generation alternative energy source.

In such a solar cell, for photoelectric conversion, impurity layers are formed to form pn junctions, and electrodes are formed to be connected to an n-type one of the impurity layers and/or p-type one of the impurity layers. In order to enhance the characteristics of the impurity layers, a structure in which different amounts of impurities are injected into the impurity layers, respectively, has been proposed. In such a structure, however, surface re-combination of holes and electrons in a region contacting each electrode may be increased, thereby degrading efficiency of the solar cell.

SUMMARY

Therefore, in view of the above problems, and one object is to provide a solar cell including an impurity layer with an improved structure, thereby achieving enhanced efficiency.

Another object is to provide a method for manufacturing a solar cell, which includes an impurity layer with an improved structure, thereby achieving enhanced efficiency, using a simple process.

In accordance with one aspect, the above and other objects may be accomplished by the provision of a solar cell including a semiconductor substrate having a first conductivity type, an emitter layer on a surface of the semiconductor substrate, the emitter layer having a second conductivity type different from the first conductivity type, and electrodes including a first electrode electrically connected to the emitter layer, and a second electrode electrically connected to the semiconductor substrate, wherein the emitter layer includes a high-concentration doping portion adjacent to the first electrode, and a low-concentration doping portion in a region that does not include the high-concentration doping portion, the low-concentration doping portion having a higher resistance than the high-concentration doping portion, wherein the high-concentration doping portion includes a first region having a first resistance, and a second region having a second resistance higher than the first resistance.

In accordance with another aspect, there is provided a solar cell including a semiconductor substrate having a first conductivity type, an emitter layer on one surface of the semiconductor substrate, the emitter layer having a second conductivity type different from the first conductivity type, a back surface field layer on another surface of the semiconductor substrate, the back surface field layer having the first conductivity type, and electrodes including a first electrode electrically connected to the emitter layer, and a second electrode electrically connected to the back surface field layer, wherein at least one of the emitter layer and the back surface field layer includes a high-concentration doping portion adjacent to the first electrode or the second electrode, respectively, and a low-concentration doping portion in a region that does not include the high-concentration doping portion, the low-concentration doping portion having a higher resistance than the high-concentration doping portion, wherein the high-concentration doping portion includes a first region having a first resistance, and a second region having a second resistance higher than the first resistance.

In accordance with another aspect, there is provided a method for manufacturing a solar cell, including forming an impurity layer at a semiconductor substrate, wherein the forming the impurity layer includes forming a low-concentration doping portion by doping impurities into the semiconductor substrate, and forming a high-concentration doping portion having a lower resistance than the low-concentration doping portion by selectively applying heat to a glass composition layer formed over the low-concentration doping portion, wherein the forming of the high-concentration doping portion includes forming a first region having a first resistance, and a second region having a higher resistance than the first resistance.

BRIEF DESCRIPTION OF THE DRAWINGS

The above and other objects, features and other advantages will be more clearly understood from the following detailed description taken in conjunction with the accompanying drawings, in which.

DETAILED DESCRIPTION OF THE PREFERRED EMBODIMENTS

Figure 1:
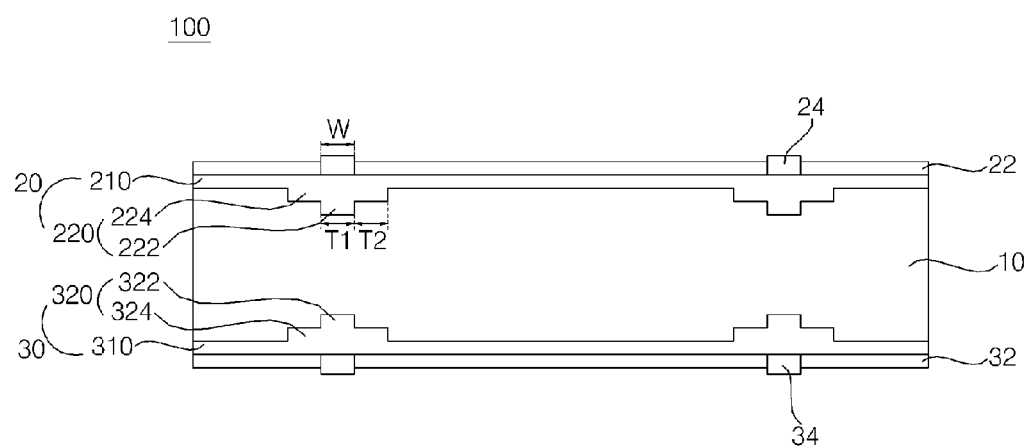
FIG. 1 is a sectional view of a solar cell according to an exemplary embodiment of the present invention.

Reference will now be made in detail to the preferred embodiments of the present invention, examples of which are illustrated in the accompanying drawings. These embodiments are not intended to limit the present invention. Other embodiments may also be provided.

Constituent elements other than elements constituting essential features of the present invention may be omitted from the drawings, for clarity of description. Like reference numerals refer to like elements throughout. In the drawings, the widths, thicknesses, etc. of constituent elements may be exaggerated or reduced for clarity and convenience of illustration. The present invention is not limited to the illustrated thicknesses, widths, etc.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, in the description of the embodiments, it will be understood that when a layer (or film), a region, a pad, a pattern or a structure is referred to as being disposed 'on/above/over' another layer, region, pad, pattern or substrate, it can be directly in contact with another layer, region, pad, pattern or substrate, or one or more intervening layers, regions, pads, patterns or structures may also be present. In addition, it will also be understood that when a layer (or film), a region, a pad, a pattern or a structure are referred to as being disposed 'between' two layers, two regions, two pads, two patterns or two structures, it can be the only layer, region, pad, pattern or structure between the two layers, the two regions, the two pads, the two patterns and the two structures or one or more intervening layers, regions, pads, patterns or structures may also be present.

Hereinafter, a solar cell according to an exemplary embodiment of the present invention and a method for manufacturing the same will be described in detail with reference to the accompanying drawings.

Figure 2:
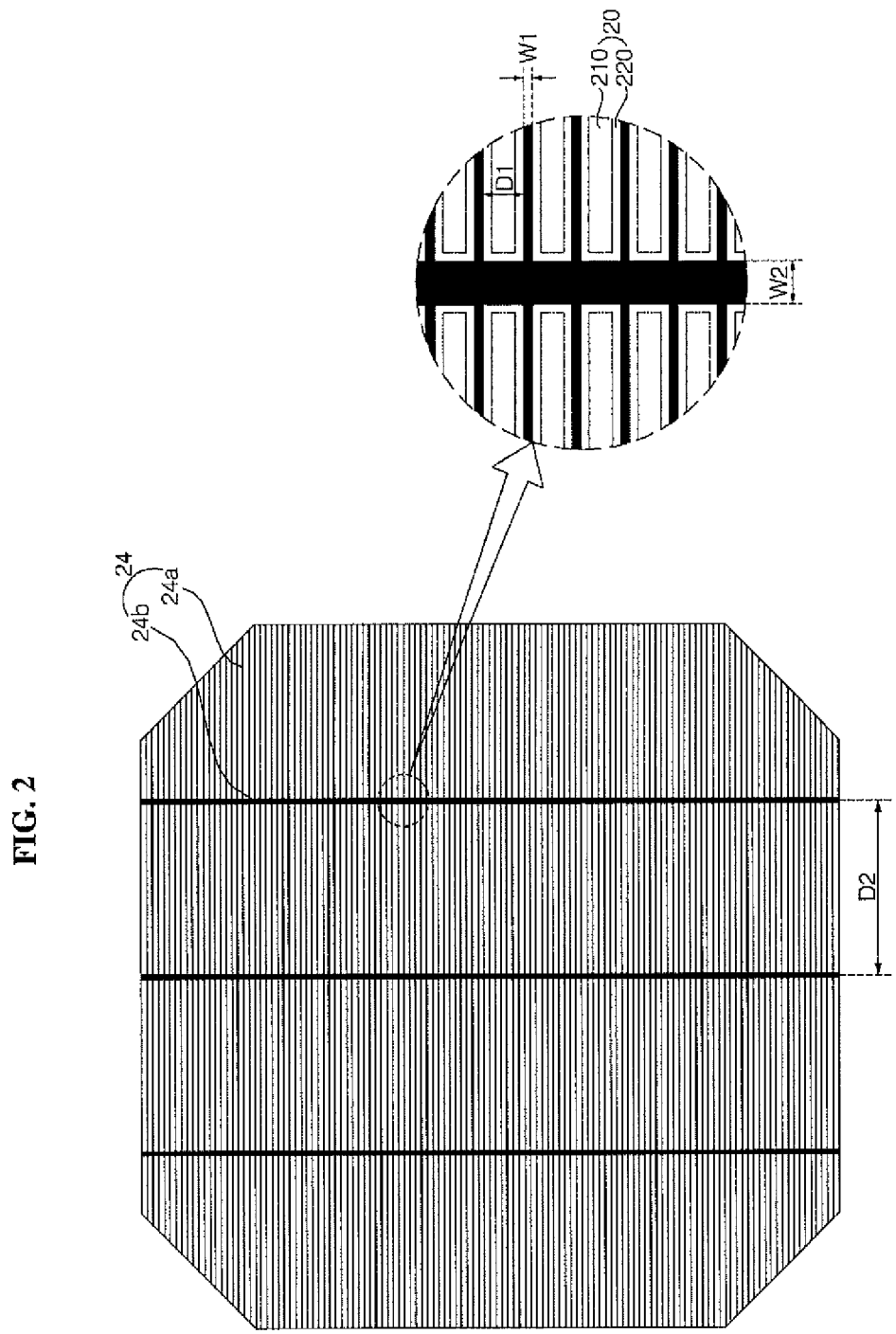
FIG. 2 is a plane view schematically illustrating structures of a first electrode and an emitter layer in the solar cell of FIG. 1.

FIG. 1 is a sectional view of a solar cell according to an exemplary embodiment of the present invention. FIG. 2 is a plane view schematically illustrating structures of a first electrode and an emitter layer in the solar cell of FIG. 1.

Referring to FIGS. 1 and 2, the solar cell according to the illustrated embodiment, which is designated by reference numeral "100", includes a semiconductor substrate 10, impurity layers 20-30 formed at the semiconductor substrate 10, and electrodes 24-34 electrically connected to the semiconductor substrate 10 or impurity layers 20 and 30. In more detail, the impurity layers 20-30 may include an emitter layer 20 formed over a first surface (hereinafter, referred to as a "front surface") of the semiconductor substrate 10, and a back surface field layer 30 formed over a second surface (hereinafter, referred to as a "back surface") of the semiconductor substrate 10. The electrodes 24-34 may include first electrodes 24 electrically connected to the emitter layer 20, and second electrodes 34 electrically connected to the semiconductor substrate 10 or the back surface field layer 30. In addition, the solar cell 100 may further include an anti-reflective film 22 and a passivation film 32. Hereinafter, this will be described in more detail.

The semiconductor substrate 10 may include various semiconductor materials. For example, the semiconductor substrate 10 may include silicon containing impurities of a first conductivity type. For silicon, monocrystalline silicon or polycrystalline silicon may be used. The first conductivity type may be a p type. That is, the semiconductor substrate 10 may be monocrystalline or polycrystalline silicon doped with a group-III element such as boron (B), aluminum (Al), gallium (Ga), and indium (In).

When the semiconductor substrate 10 has a p-type conductivity, the emitter layer 20 formed at the front surface of the semiconductor substrate 10 has an n-type conductivity and, as such, pn junctions are formed. When the pn junctions are irradiated with light, electrons generated in accordance with photoelectric effect migrate toward the front surface of the semiconductor substrate 10, to be collected by the first electrodes 24. Meanwhile, holes migrate toward the back surface of the semiconductor substrate 10, to be collected by the second electrodes 34. As a result, electric energy is generated.

Although not shown, the front surface and/or back surface of the semiconductor substrate 10 may be provided with irregularities, for example, having pyramid-shaped patterns in accordance with a texturing process. When the semiconductor substrate 10 has increased surface roughness in accordance with formation of irregularities over, for example, the front surface thereof, it is possible to reduce the reflectance of the front surface of the semiconductor substrate 10. Accordingly, it is possible to increase the amount of light reaching the pn junctions formed at an interface between the semiconductor substrate 10 and the emitter layer 20, and thus to minimize light loss. Of course, the present invention is not limited to the above-described structure. For example, irregularities may be formed only over the front surface of the semiconductor substrate 10. Alternatively, irregularities may not be formed at all.

The emitter layer 20 formed at the front surface of the semiconductor substrate contains impurities of a second conductivity type. The emitter layer 20 forms pn junctions, together with the semiconductor substrate 10. In this case, the emitter layer 20 may be formed by doping, in the semiconductor substrate 10, a group-V element such as phosphorous (P), arsenic (As), bismuth (Bi), and antimony (Sb).

In an exemplary embodiment, the emitter layer 20 has a selective emitter structure including a front surface low-concentration doping portion 210 having a relatively low doping concentration while exhibiting high resistance, and a front surface high-concentration doping portion 220 having a relatively high doping concentration while exhibiting low resistance. In more detail, the front surface high-concentration doping portion 220, which exhibits low resistance, is formed in the semiconductor substrate 10 in a region adjacent to each first electrode 24. The front surface low-concentration doping portion 210 is formed in the semiconductor substrate 10 in a region other than the region where the front surface high-concentration doping portion 220 is formed. The front surface high-concentration doping portion 220 may have a greater doping depth than the front surface low-concentration doping portion 210.

Thus, in the illustrated embodiment, the front surface low-concentration doping portion 210 is formed in a region between adjacent ones of the first electrodes 24, upon which light is incident, to realize a shallow emitter. Accordingly, it is possible to enhance the current density of the solar cell 100. In addition, the front surface high-concentration doping portion 220 is formed in a region adjacent to each first electrode 24, to reduce contact resistance to the first electrode 24. Thus, the emitter layer according to the illustrated embodiment can maximize the efficiency of the solar cell 100 in accordance with the selective emitter structure thereof.

In an exemplary embodiment, the front surface high-concentration doping portion 220 may include a first region 222 having a first resistance, and second regions 224 each having a second resistance higher than the first resistance. In this case, the first region 222 may have a greater doping depth than the second regions 224. This will be described in more detail later.

The anti-reflective film 22 and first electrodes 24 may be formed on the emitter layer 20 at the front surface of the semiconductor substrate 10.

The anti-reflective film 22 may be substantially formed over the entirety of the front surface of the semiconductor substrate 10, except for regions where the first electrodes 24 are formed. The anti-reflective film 22 reduces the reflectance of light incident through the front surface of the semiconductor substrate 10. Accordingly, it is possible to increase the amount of light reaching the pn junctions formed at the interface between the semiconductor substrate 10 and the emitter layer 20. Thus, short-circuit current Isc of the solar cell 100 can be increased.

The anti-reflective film 22 may also function as a passivation film to inactivate defects present in the surface or bulk of the emitter layer 20. Accordingly, re-combination sites of minority carriers are removed. Thus, it may be possible to increase the opening voltage Voc of the solar cell 100. As the opening voltage and short-circuit current of the solar cell 100 are increased by the anti-reflective film 22, the conversion efficiency of the solar cell 100 can be enhanced.

The anti-reflective film 22 may contain various materials capable of preventing reflection. For example, the anti-reflective film may include a silicon nitride film. Of course, the present invention is not limited to such a material and, as such, the anti-reflective film 22 may contain various materials. That is, the anti-reflective film 22 may have a single-layer film structure formed by one film selected from the group comprising of a silicon nitride film, a silicon nitride film containing hydrogen, a silicon oxide film, a silicon oxide nitride film, an $MgF_2$ film, a ZnS film, a $TiO_2$ film, and a $CeO_2$ film or may have a multi-layer structure formed by a combination of two or more films selected from the group.

Each first electrode 24 may extend through the anti-reflective film 22 at the front surface of the semiconductor substrate 10, to be electrically connected to the emitter layer 20. Each first electrode 24 may have various planar shapes. For example, as shown in FIG. 2, each first electrode 24 may include finger electrodes 24a arranged in parallel while having a first spacing D1. In addition, each first electrode 24 may include a bus electrode 24b formed to extend in a direction crossing the finger electrodes 24a. Each first electrode 24 may include one bus electrode 24b. Alternatively, as shown in FIG. 2, each first electrode 24 may include a plurality of bus electrodes 24b arranged in parallel while having a second spacing D2 greater than the first spacing D1. In this case, each bus bar 24b may have a width W2 greater than the width of each finger electrode 24a, W1. Of course, the present invention is not limited to such widths. For example, the bus bar 24b has the same width as the finger electrodes 24a. That is, the shape of each first electrode 24 is only illustrative, and the present invention is not limited thereto. Each first electrode 24 may be made of various materials.

Again referring to FIG. 1, the back surface field layer 30, which contains impurities of the first conductivity type in a higher doping concentration than the semiconductor substrate 10, is formed at the back surface of the semiconductor substrate 10. The back surface field layer 30 is not essential and, as such, it may be dispensed with in accordance with design, etc.

In an exemplary embodiment, the back surface field layer 30 may have a selective back surface field structure including a back surface low-concentration doping portion 310 having a relatively low doping concentration while exhibiting high resistance, and a back surface high-concentration doping portion 320 having a relatively high doping concentration while exhibiting low resistance. In more detail, the back surface high-concentration doping portion 320, which exhibits low resistance, is formed in the semiconductor substrate 10 in a region adjacent to each second electrode 34.

The back surface low-concentration doping portion 310 is formed in the semiconductor substrate 10 in a region other than the region where the back surface high-concentration doping portion 320 is formed. The back surface high-concentration doping portion 320 may have a greater doping depth than the back surface low-concentration doping portion 310.

Thus, in the illustrated embodiment, the back surface low-concentration doping portion 310 is formed in a region between adjacent ones of the second electrodes 34, upon which light is incident, thereby effectively preventing re-combination of electrons and holes. Accordingly, it is possible to enhance the current density of the solar cell 100 while increasing the opening voltage of the solar cell 100. In addition, the back surface high-concentration doping portion 320 is formed in a region adjacent to each second electrode 34, to reduce contact resistance to the second electrode 34. That is, the back surface field layer 30 according to the illustrated embodiment enhances the efficiency of the solar cell 100 through the selective back surface field structure thereof.

In an exemplary embodiment, the back surface high-concentration doping portion 320 may include a first region 322 having a third resistance, and second regions 324 each having a fourth resistance higher than the third resistance. This will be described in more detail later. In this case, the first region 322 may have a greater doping depth than the second regions 324.

The passivation film 32 and second electrodes 34 may be formed at the back surface of the semiconductor substrate 10.

The passivation film 32 may be substantially formed over the entirety of the back surface of the semiconductor substrate 10, except for regions where the second electrodes 34 are formed. The passivation film 32 may inactivate defects present at the back surface of the semiconductor substrate 10, thereby removing re-combination sites of minority carriers. Thus, it is possible to increase the opening voltage of the solar cell 100.

The passivation film 32 may be made of a transparent insulating material, to allow light to pass therethrough. Accordingly, light can be incident upon the back surface of the semiconductor substrate 10 through the passivation film 32 and, as such, the efficiency of the solar cell 100 can be enhanced. The passivation film 32 may have a single-layer film structure formed by one film selected from the group comprising of a silicon nitride film, a silicon nitride film containing hydrogen, a silicon oxide film, a silicon oxide nitride film, an $MgF_2$ film, a ZnS film, a $TiO_2$ film, and a $CeO_2$ film or may have a multi-layer structure formed by a combination of two or more films selected from the group. Of course, the present invention is not limited to such structures. The passivation film 32 may include various materials.

Each second electrode 34 may include various metals exhibiting excellent electrical conductivity or the like. Each second electrode 34 may have a structure similar to the structure of each first electrode 24 shown in FIG. 2. Accordingly, no further detailed description will be given of a concrete structure of each second electrode 34.

In the illustrated embodiment, the emitter layer 20, which has a selective emitter structure, and the back surface field layer 30, which has a selective back surface field structure, can maximize the efficiency of the solar cell 100. This will be described in more detail. In the following description, the front surface high-concentration doping portion 220 and back surface high-concentration doping portion 320 will be collectively referred to as "high-concentration doping portions 220 and 320", for convenience of description. The first region 222 of the front surface high-concentration doping portion 220 and the first region 322 of the back surface high-concentration doping portion 320 will be collectively referred to as "first regions 222 and 322". The second regions 224 of the front surface high-concentration doping portion 220 and the second regions 324 of the back surface high-concentration doping portion 320 will be collectively referred to as "second regions 224 and 324". In addition, the first electrodes 24 electrically connected to the front surface high-concentration doping portion 220 and the second electrodes 34 electrically connected to the back surface high-concentration doping portion 320 will be collectively referred to as "electrodes 24 and 34".

In the illustrated embodiment, the front surface high-concentration doping portion 220 may include the first and second regions 222 and 224 which exhibit different resistances. The back surface high-concentration doping portion 320 may include the first and second regions 322 and 324 which exhibit different resistances. Accordingly, re-combination of holes and electrons is increased by the high-concentration doping portions 220 and 320. As a result, it is possible to prevent a decrease in opening voltage. This will be described in more detail.

The front surface high-concentration doping portion 220 generally has a greater width than each first electrode 24. The back surface high-concentration doping portion 320 generally has a greater width than each second electrode 34. When the high-concentration doping portions 220 and 320 have the same widths as the electrodes 24 and 34, respectively, the electrodes 24 and 34 may not completely or partially contact the high-concentration doping portions 220 and 320, respectively, due to process errors inevitably generated during formation of the electrodes 24 and 34. In this case, it may be difficult to decrease contact resistances to the electrodes 24 and 34. To this end, the high-concentration doping portions 220 and 320 are formed to be wider than the electrodes 24 and 34, taking into consideration process margins. Meanwhile, the low resistances of the high-concentration doping portions 220 and 320 are effective to decrease contact resistances to the electrodes 24 and 34. However, surface re-combination may easily occur due to high concentrations of the high-concentration doping portions 220 and 320. As a result, the current density and opening voltage of the solar cell 100 may be decreased.

Taking into consideration such problems, the high-concentration doping portions 220 and 320 include the first and second regions 222 and 224 exhibiting different resistances and the first and second regions 322 and 324 exhibiting different resistances, respectively, in accordance with the illustrated embodiment. In this case, the first regions 222 and 322, which correspond to middle portions having high possibility of contacting respective electrodes 24 and 34, have relatively-low first and third resistances, respectively. The second regions 224 and 324, which are arranged at outsides of respective first regions 222 and 322 and contact respective electrodes 24 and 34 only when there are process errors, have second and fourth resistances higher than the first and third resistances, but lower than the resistances of the low-concentration doping portions 210 and 310, respectively. Thus, even at a maximum process error rate, the electrodes 24 and 34 may be arranged such that at least portions of the electrodes 24 and 34 contact the first regions 222 and 322, respectively, and the remaining portions of the electrodes 24 and 34 are disposed in the second regions 224 and 324, respectively.

That is, in the illustrated embodiment, it is possible to decrease contact resistances to respective electrodes 24 and 34 in regions that contact respective electrodes 24 and 34, namely, respective high-concentration doping portions 220 and 320, by making the high-concentration doping portions 220 and 320 have lower resistances than respective low-concentration doping portions 210 and 310, taking into consideration process margins. In addition, it is possible to reduce surface re-combination in the second regions 224 and 324 corresponding to process margin regions contacting respective electrodes 24 and 34 only when there are process errors by making the first regions 222 and 322 having high possibility of contacting respective electrodes 24 and 34 have relatively-low first and third resistances, respectively, while making the second regions 224 and 324 have relatively-high second and fourth resistances, respectively. Accordingly, it is possible to minimize current density decrease and opening voltage decrease. Thus, it is possible to maximize the efficiency of the solar cell 100.

In the illustrated embodiment, it is possible to more effectively cope with misalignment caused by process errors in that the second regions 224 and 324 are arranged at opposite sides of the corresponding first regions 222 and 322.

In the emitter layer 20, the ratio of the width of each second region 224, T2, to the width of the first region 222, T1, may be 0.5 to 1.5. When the ratio exceeds 1.5, the second region 224 may be excessively widened, so that it may be difficult to effectively prevent current density decrease and opening voltage decrease. On the other hand, when the ratio is less than 0.5, the first electrode 24 may extend to the front surface low-concentration doping portion 210 beyond the second region 224 when there are process errors. That is, the ratio is determined, taking into consideration process errors and the area of the second region 224. Similarly, in the back surface field layer 30, the ratio of the width of the second region 324 to the width of the first region 322 may be 0.5 to 1.5. Of course, the present invention is not limited to the above-described ratios. The above-described ratios may be varied, taking into consideration process errors, etc.

The ratio T1 of the first region 222 to the width W of the first electrode 24 may be 0.8 to 1.2. The width W of the first electrode 24 corresponds to the first width W1 at the finger electrode 24a while corresponding to the second width W2 at the bus bar electrode 24b. Accordingly, the width of the first region 222 in a region adjacent to the finger electrode 24a is taken into consideration, based on the first width W1, whereas the width of the first region 224 in a region adjacent to the bus bar electrode 24b is taken into consideration, based on the second width W2. When the ratio exceeds 1.2, the first region, which has a relatively high concentration and low resistance, is excessively widened. As a result, surface re-combination occurs in this region, thereby degrading efficiency of the solar cell 100. On the other hand, when the ratio is less than 0.8, the contact area between the first electrode 24 and the first region 222 is insufficient, so that it may be difficult to sufficiently decrease contact resistance. Similarly, the ratio of the width of the second electrode 34 to the width of the first region 322 in the back surface field layer 30 may be 0.8 to 1.2. Of course, the present invention is not limited to the above-described ratios. The above-described ratios may be varied, taking into consideration process errors, etc.

In an exemplary embodiment, the resistances of the first regions 222 and 322 may be 30 to 70 Ω/square (ohms/square) (more accurately, 30 to 40 Ω/square). The resistances of the second regions 224 and 324 may be 80 to 90 Ω/square. The low-concentration doping portions 210 and 310 may exhibit resistance of 100 Ω/square or more (more accurately, 100 to 120 Ω/square). The resistance of each of the second regions 224 and 324 is determined to be at least a resistance capable of securing a predetermined level or more of contact resistance to the corresponding electrode 24 or 34. Meanwhile, the resistance of each second region 224 of the emitter layer 20 is determined to be within a range capable of preventing formation of shunts in the semiconductor substrate 10. The resistances of the low-concentration doping portions 210 and 310 are determined to be a level enabling formation of a shallow emitter. Of course, the present invention is not limited to the above-described resistances. Various resistances may be employed so long as they satisfy resistance relations thereamong.

In the illustrated embodiment, the case in which the semiconductor substrate 10 and back surface field layer 30 contain p-type impurities, and the emitter layer 20 contains n-type impurities is illustrated. Of course, the present invention is not limited to the illustrated case. For example, the semiconductor substrate 10 and back surface field layer 30 may contain n-type impurities, and the emitter layer 20 may contain p-type impurities.

Hereinafter, a method for manufacturing a solar cell in accordance with an exemplary embodiment of the present invention will be described in detail with reference to FIGS. 3A to 3K. In the following description, no description will be given of the content identical to that described above.

Figure 3A:
FIGS. 3A to 3K are sectional views illustrating a method for manufacturing a solar cell in accordance with an exemplary embodiment of the present invention.

First, as shown in FIG. 3A, a semiconductor substrate 10 having a first conductivity type. Although not shown, the front surface and/or back surface of the semiconductor substrate 10 may be provided with irregularities in accordance with a texturing process. As the texturing process, wet or dry texturing may be employed. Wet texturing may be carried out by dipping the semiconductor substrate 10 in a texturing solution. Wet texturing is advantageous in that process time is short. Dry texturing is carried out by cutting a surface of the semiconductor substrate 10, using a diamond drill, a laser or the like. Dry texturing achieves formation of uniform irregularities, but requires a long process time. Furthermore, the semiconductor substrate 10 may be damaged. In accordance with the present invention, the semiconductor substrate 10 may be textured, using various methods.

Figure 3B:
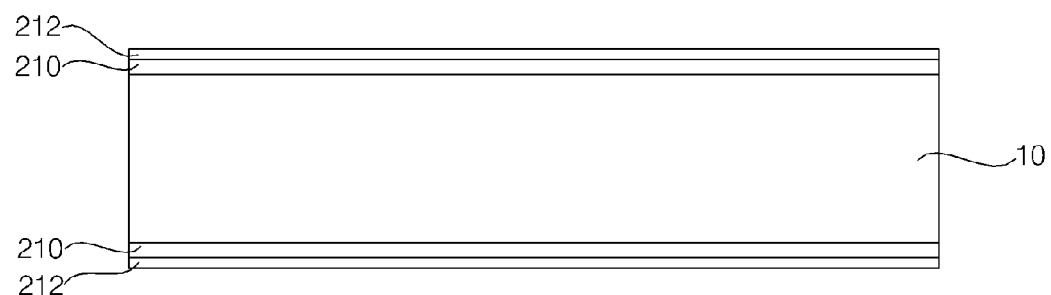
Figure 3C:
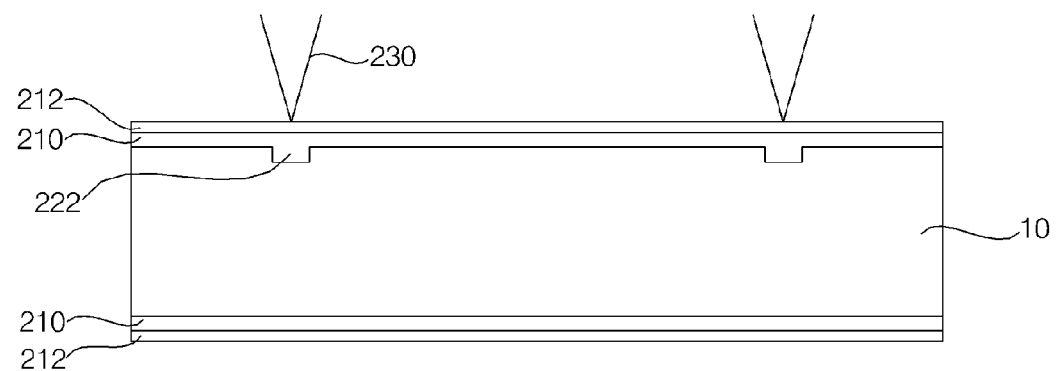
Figure 3D:
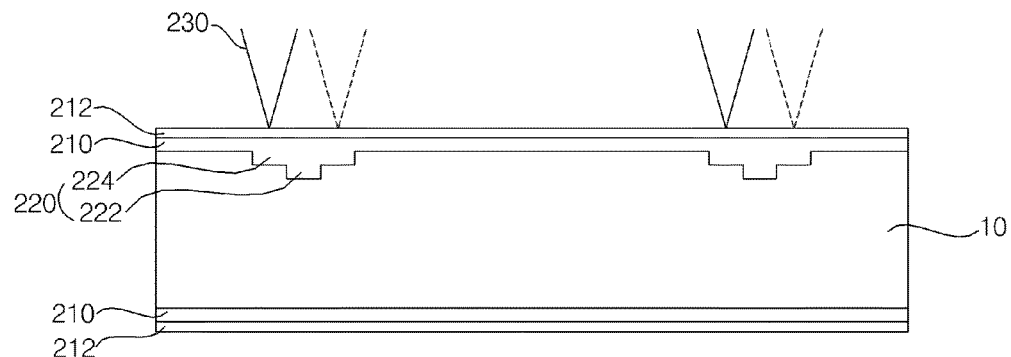

Thereafter, as shown in FIGS. 3B to 3D, an emitter layer 20 is formed at the front surface of the semiconductor substrate 10. This will be described in more detail.

First, as shown in FIG. 3B, impurities are doped in the semiconductor substrate 10 in accordance with a thermal diffusion process, thereby forming a front surface low-concentration doping portion 210. The thermal diffusion process is carried out by diffusing a gaseous compound of impurities (for example, a compound containing phosphorous (P)) into the semiconductor substrate 10 under the condition that the semiconductor substrate 10 is in a heated state, thereby doping the semiconductor substrate 10 with the impurities. This process is advantageous in that it is simple and thus, inexpensive. Using the above-described thermal diffusion process, it may be possible to form low-concentration doping portions 210 over opposite surfaces of the semiconductor substrate 10, respectively. A glass composition layer 212 may be formed over the front surface low-concentration doping portion 210. The glass composition layer 212 is inevitably formed during formation of the front surface low-concentration doping portion 210 using the thermal diffusion process. For example, the glass composition layer 212 may contain phosphorous silicate glass (PSG).

Subsequently, as shown in FIGS. 3C and 3D, heat is selectively applied to the glass composition layer 212 formed over the front surface low-concentration doping portion 210, thereby forming front surface high-concentration doping portions 220 having lower resistance than the front surface low-concentration doping portion 210. When the glass composition layer 212 is heated in selected regions, the impurities (for example, phosphorous) contained in the glass composition layer 212 are diffused from the selected regions into portions of the semiconductor substrate 10 corresponding to the selected regions, thereby increasing the doping concentration of the selected regions. As a result, the resistance of the selected regions is lowered.

In more detail, after formation of first regions 222 as shown in FIG. 3C, second regions 224 may be formed as shown in FIG. 3D. Of course, the present invention is not limited to such a procedure. For example, the first regions 222 may be formed after formation of the second regions 224.

Various methods may be employed for selective heating of the regions corresponding to respective front surface high-concentration doping portions 220. For example, a method of irradiation with laser beams 230 may be employed. In this case, it is possible to make the first and second regions 222 and 224 have different doping concentrations and different resistances by employing different powers of laser beams to irradiate the first and second regions 222 and 224.

That is, when regions corresponding to respective first regions 222 are irradiated with laser beams 230, as shown in FIG. 3C, relatively high power is used and, as such, the first regions 222 have a relatively high doping concentration and low resistance. On the other hand, when regions corresponding to respective second regions 224 are irradiated with laser beams 230, as shown in FIG. 3D, relatively low power is used and, as such, the second regions 224 have a relatively low doping concentration and high resistance. For example, when a pulse laser is employed, the power of laser beams irradiating the first regions 222 may be 1.75 to 2 Joules, and the power of laser beams irradiating the second regions 224 may be 1 to 1.5 Joules. Of course, the present invention is not limited to the above-described values. The laser power may be varied in accordance with the kind of laser beams and the wavelength range of laser beams. In place of different laser powers, different laser beams may be employed.

The glass composition layer 212 may be selectively heated by laser beams 230 in accordance with a pattern inputted to a laser. It is possible to form the first and second regions 222 and 224 such that they have small widths.

In the illustrated embodiment, the impurities contained in the glass composition layer 212 formed in accordance with the thermal diffusion process are diffused into the semiconductor substrate 10, thereby forming a selective emitter structure. Accordingly, it is possible to form a selective emitter structure, using a simple process, in that it is unnecessary to use a process for forming a separate doping layer for the selective emitter structure. In addition, it is possible to easily make each front surface high-concentration doping portion 220 have the first and second regions 222 and 224 with different resistances, using laser beams.

Figure 3E:
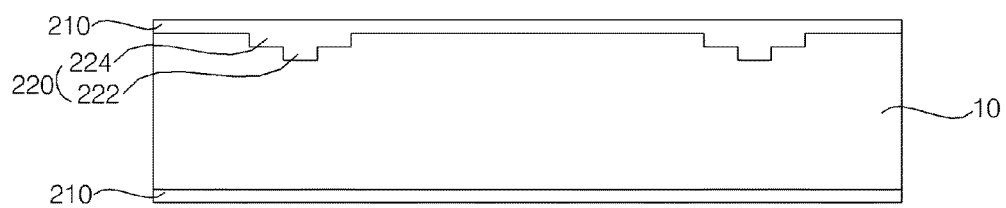

Thereafter, as shown in FIG. 3E, the glass composition layer 212 is removed after formation of the front surface high-concentration doping portions 220. Removal of the glass composition layer 212 may be achieved using an acid etchant such as hydrofluoric acid or hydrochloric acid.

Figure 3F:
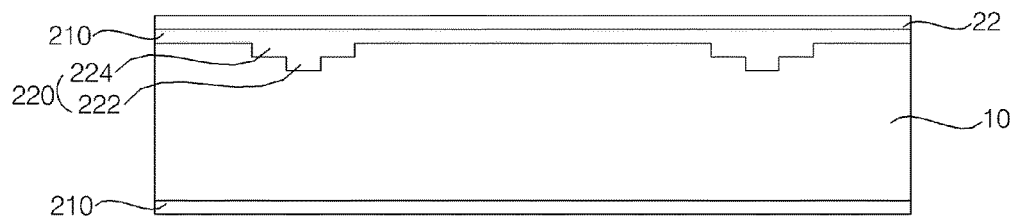

Subsequently, as shown in FIG. 3F, an anti-reflective film 22 may be formed over the emitter layer 20. The anti-reflective film 22 may be formed in accordance with various methods such as a vacuum deposition method, a chemical vapor deposition method, a spin coating method, a screen printing method and a spray coating method.

Figure 3G:
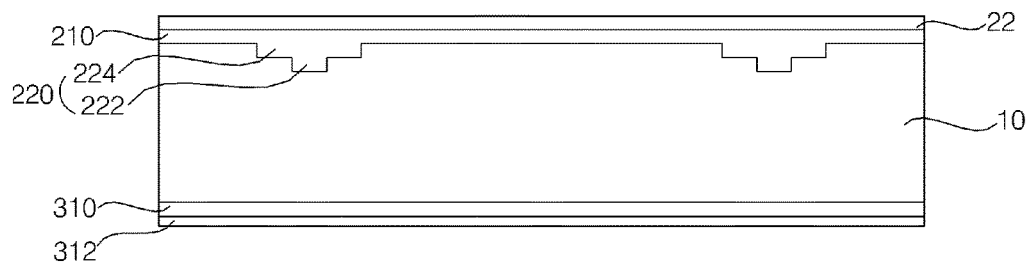
Figure 3H:
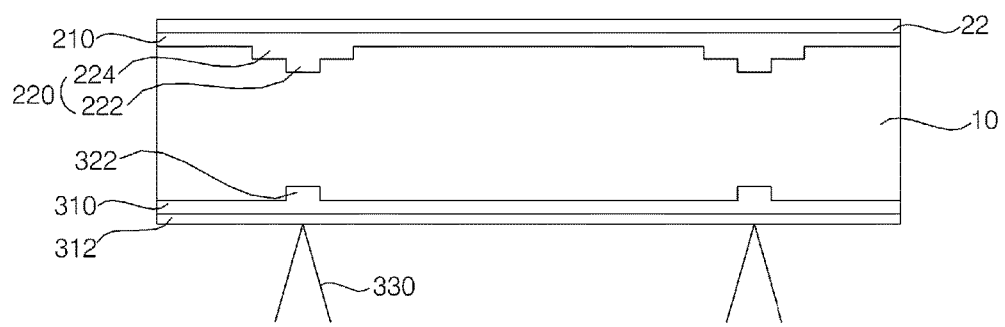
Figure 3I:
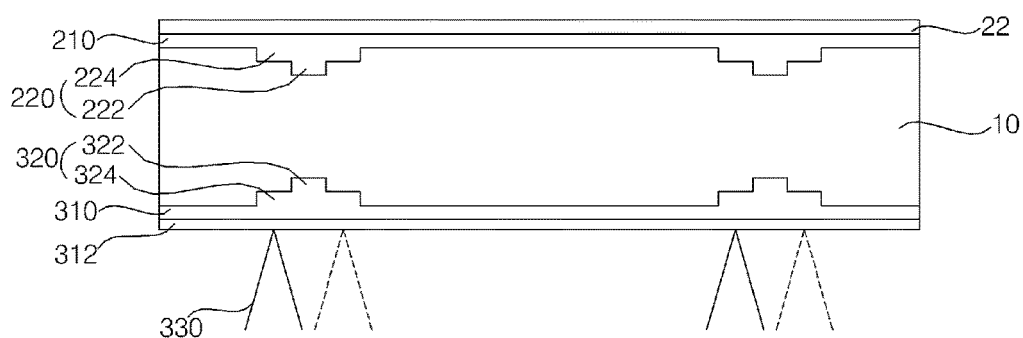

As shown in FIGS. 3G to 3I, a back surface field layer 30 is then formed at the back surface of the semiconductor substrate 10. This will be described in more detail.

First, as shown in FIG. 3G, the semiconductor substrate 10 is doped with impurities in accordance with a thermal diffusion process, thereby forming a back surface low-concentration doping portion 310. In more detail, formation of the back surface low-concentration doping portion 310 may be carried out after the back surface of the semiconductor substrate 10 is etched to remove the low-concentration doping portion 210 formed at the back surface of the semiconductor substrate 10. Alternatively, the back surface low-concentration doping portion 310 may be formed in accordance with an over-doping process in which the back surface is doped with impurities in a higher concentration than the front surface.

Formation of the back surface low-concentration doping portion 310 at the back surface of the semiconductor substrate 10 may be achieved in accordance with a thermal diffusion process. A glass composition layer 312 may be formed over the back surface low-concentration doping portion 310. The glass composition layer 312 is inevitably formed during formation of the back surface low-concentration doping portion 310 using the thermal diffusion process. For example, the glass composition layer 212 may contain boron silicate glass (BSG).

Subsequently, as shown in FIGS. 3H and 3I, heat is selectively applied to the glass composition layer 312 formed over the back surface low-concentration doping portion 310, thereby forming back surface high-concentration doping portions 320 having lower resistance than the back surface low-concentration doping portion 310. When the glass composition layer 312 is heated in selected regions, the impurities (for example, boron) contained in the glass composition layer 312 are diffused from the selected regions into portions of the semiconductor substrate 10 corresponding to the selected regions, thereby increasing the doping concentration of the selected regions. As a result, the resistance of the selected regions is lowered.

In more detail, after formation of first regions 322 as shown in FIG. 3H, second regions 324 may be formed as shown in FIG. 3I. Of course, the present invention is not limited to such a procedure. For example, the first regions 322 may be formed after formation of the second regions 324.

Various methods may be employed for selective heating of the regions corresponding to respective back surface high-concentration doping portions 320. For example, a method of irradiation with laser beams 330 may be employed. In this case, it is possible to make the first and second regions 322 and 324 have different doping concentrations and different resistances by employing different powers of laser beams irradiating the first and second regions 322 and 324.

That is, when regions corresponding to respective first regions 322 are irradiated with laser beams 330, as shown in FIG. 3H, relatively high power is used and, as such, the first regions 322 have a relatively high concentration and low resistance. On the other hand, when regions corresponding to respective second regions 324 are irradiated with laser beams 330, as shown in FIG. 3I, relatively low power is used and, as such, the second regions 324 have a relatively low concentration and high resistance. Detailed laser powers are similar to those of the emitter layer 20 and, as such, no further detailed description thereof will be given.

The glass composition layer 312 may be selectively heated by laser beams 330 in accordance with a pattern inputted to a laser. It is possible to form the first and second regions 322 and 324 such that they have small widths.

In the illustrated embodiment, the impurities contained in the glass composition layer 312 formed in accordance with the thermal diffusion process are diffused into the semiconductor substrate 10, thereby forming a selective back surface field structure. Accordingly, it is possible to form a selective back surface field structure, using a simple process, in that it is unnecessary to use a process for forming a separate doping layer for the selective back surface field structure. In addition, it is possible to easily make each back surface high-concentration doping portion 320 have the first and second regions 322 and 324 with different resistances, using laser irradiation.

Figure 3J:
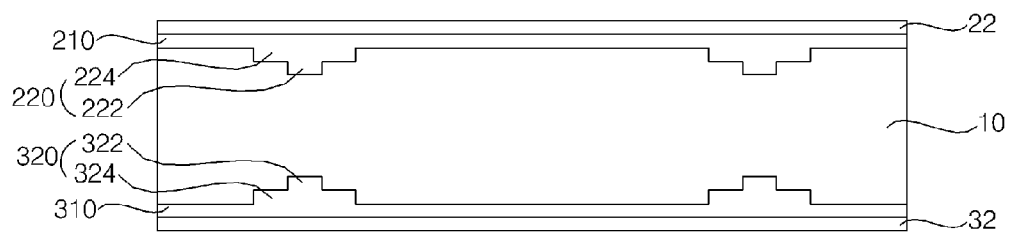

Thereafter, as shown in FIG. 3J, the glass composition layer 312 is removed, and a passivation film 32 is then formed. Removal of the glass composition layer 312 may be achieved using an acid etchant such as hydrofluoric acid or hydrochloric acid. The passivation film 32 may be formed in accordance with various methods such as a vacuum deposition method, a chemical vapor deposition method, a spin coating method, a screen printing method and a spray coating method.

Figure 3K:
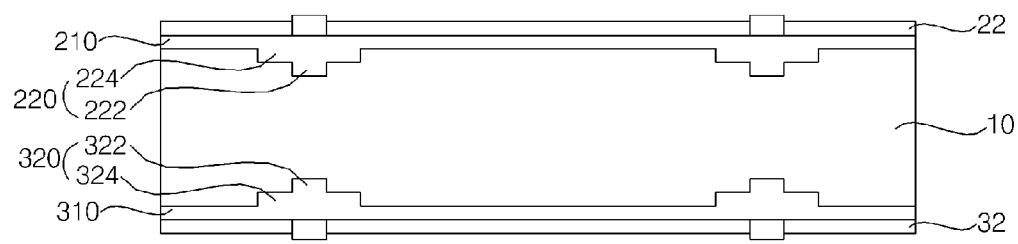

Subsequently, as shown in FIG. 3K, first electrodes 24 are formed at the front surface of the semiconductor substrate 10, to contact respective first regions 222 of the emitter layer 20. Second electrodes 34 are also formed at the back surface of the semiconductor substrate 10, to contact respective first regions 322 of the back surface field layer 30.

For formation of the first electrodes 24, openings may be formed at the anti-reflective film 22. The first electrodes 24 are formed in respective openings in accordance with various methods such as a plating method and a deposition method. For formation of the second electrodes 34, openings may be formed at the passivation film 32. The second electrodes 34 are formed in respective openings in accordance with various methods such as a plating method and a deposition method.

Alternatively, it may also be possible to form the first and second electrodes 24 and 34 having the above-described shapes by coating pastes for formation of the first and second electrodes 24 and 34 over the anti-reflective film 22 and passivation film 32, respectively, in accordance with a screen printing method, and subjecting the coated pastes to a fire through process or a laser firing contact process. In this case, it is unnecessary to perform the process of forming openings.

At least portions of the first and second electrodes 24 and 34 contact the first regions 222 and 322, respectively, even when there are process errors.

In the illustrated embodiment, the emitter layer 20 and back surface field layer 30, which are impurity layers, not only include respective high-concentration doping portions 220 and 320 including respective first regions 222 and 322 and respective second regions 224 and 324, but also include respective low-concentration doping portions 210 and 310. Accordingly, it is possible to maximize efficiency of the solar cell 100.

In this case, laser beams irradiate the glass composition layers (for example, PSG and BSG layers) formed from the impurity layers in accordance with a thermal diffusion process, thereby forming the high-concentration doping portions 220 and 320. Accordingly, it is unnecessary to form separate doping layers. Thus, it is possible to form the high-concentration doping portions 220 and 320 including respective first regions 222 and 322 and respective second regions 224 and 324, and the low-concentration doping portions 210 and 310, using simple processes.

The process sequence in the above-described embodiment is only illustrative, and may be varied.

In the above-described embodiment, the emitter layer 20 and back surface field layer 30, which are impurity layers, not only include respective high-concentration doping portions 220 and 320 including respective first regions 222 and 322 and respective second regions 224 and 324, but also include respective low-concentration doping portions 210 and 310, as described above. However, the present invention is not limited to such structures. Various alternatives may be employed, as shown in FIGS. 4 to 7.

Figure 4:
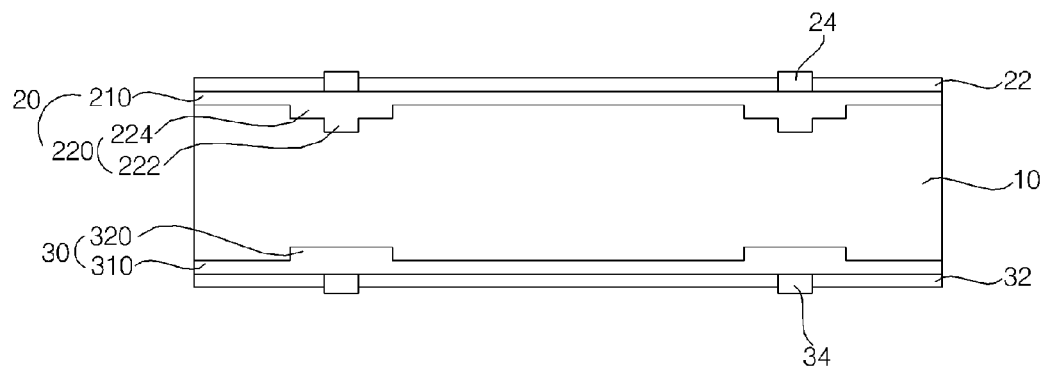
FIG. 4 is a sectional view of a solar cell according to another exemplary embodiment of the present invention.

That is, as shown in FIG. 4, the back surface field layer 30 may include the back surface high-concentration doping portions 320 and back surface low-concentration doping portion 310, but each back surface high-concentration doping portion 320 may have a uniform doping concentration and uniform resistance throughout the entire portion thereof. That is, each front surface high-concentration doping portion 220 may include the first and second regions 222 and 224, but the back surface high-concentration doping portion 320 may not include the first and second regions. Such a back surface high-concentration doping portion may be formed, using laser beams as used in the above-described embodiment. The back surface field layer 30, which has the above-described structure, may be formed in accordance with, for example, an ion injection method employing masks.

Figure 5:
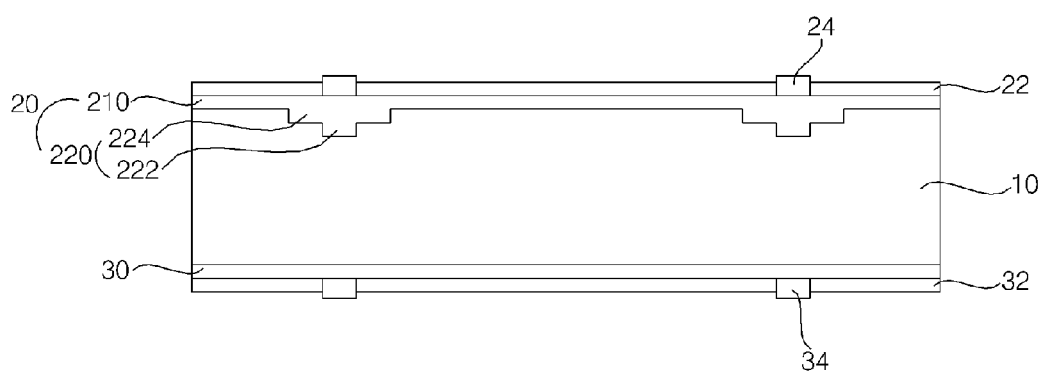
FIG. 5 is a sectional view of a solar cell according to another exemplary embodiment of the present invention.

Alternatively, as shown in FIG. 5, the back surface field layer 30 may have a uniform doping concentration and uniform resistance throughout the entire portion thereof.

In this case, the back surface field layer 30 has a reduced doping concentration throughout the entire portion thereof. Accordingly, it is possible to effectively prevent re-combination of electrons and holes occurring at the back surface of the semiconductor substrate 10. In addition, it is possible to simplify the manufacturing process of the back surface field layer 30.

Figure 6:
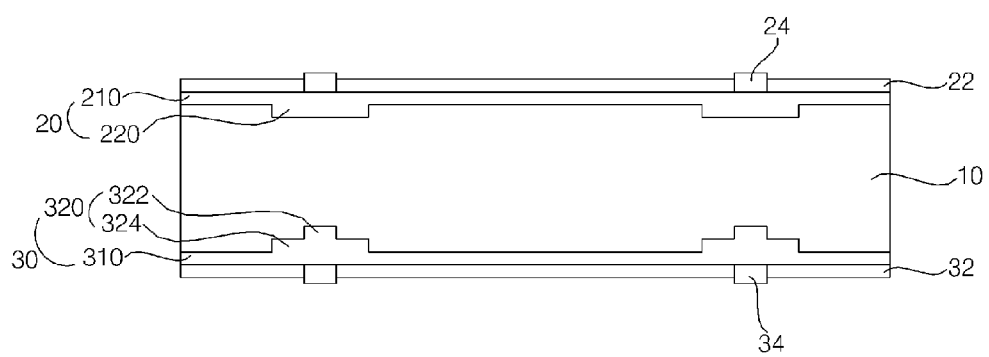
FIG. 6 is a sectional view of a solar cell according to another exemplary embodiment of the present invention.

In addition, as shown in FIG. 6, the emitter layer 20 may include the front surface high-concentration doping portions 220 and front surface low-concentration doping portion 210, but each front surface high-concentration doping portion 220 may have a uniform doping concentration and uniform resistance throughout the entire portion thereof. That is, each back surface high-concentration doping portion 320 may include the first and second regions 322 and 324, but the front surface high-concentration doping portion 220 may not include the first and second regions. Such a front surface high-concentration doping portion may be formed, using laser beams as used in the above-described embodiment. The emitter layer 20, which has the above-described structure, may be formed in accordance with, for example, an ion injection method employing masks.

Figure 7:
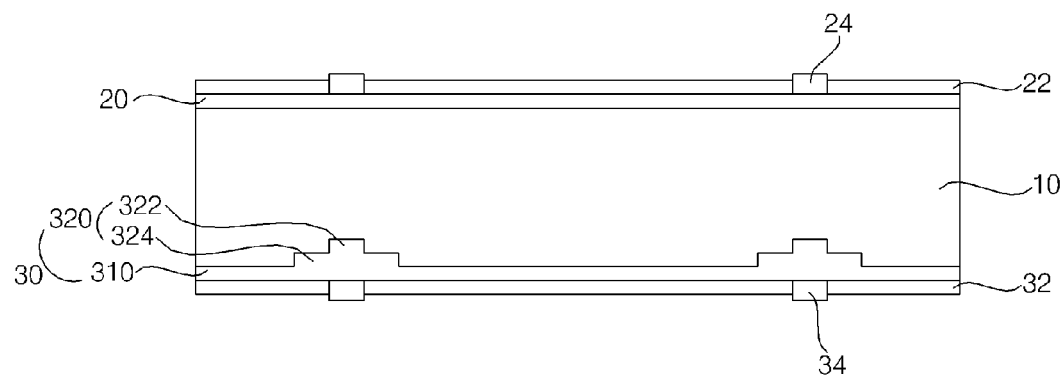
FIG. 7 is a sectional view of a solar cell according to another exemplary embodiment of the present invention.

Alternatively, as shown in FIG. 7, the emitter layer 20 may have a uniform doping concentration and uniform resistance throughout the entire portion thereof.

In this case, the emitter layer 20 has a doping concentration reduced throughout the entire portion thereof. Accordingly, it is possible to effectively prevent re-combination of electrons and holes occurring at the front surface of the semiconductor substrate 10. In addition, it is possible to simplify the manufacturing process of the emitter layer 20.

Although the preferred embodiments of the present invention have been disclosed for illustrative purposes, those skilled in the art will appreciate that various modifications, additions and substitutions are possible, without departing from the scope and spirit of the invention.

What is claimed is:

1. A method for manufacturing a solar cell, comprising:
forming an impurity layer at a semiconductor substrate, wherein the forming the impurity layer comprises
forming a low-concentration doping portion including a first low-concentration doping portion and a second low-concentration doping portion by doping impurities into the semiconductor substrate; and
forming a high-concentration doping portion including a first high-concentration doping portion and a second high-concentration doping portion having a lower resistance than the low-concentration doping portion by selectively applying heat to a glass composition layer formed over the low-concentration doping portion,
wherein the first low-concentration doping portion is formed at front and back surface of the semiconductor substrate,
wherein the first high-concentration doping portion is formed at the first low-concentration doping portion of the front surface of the semiconductor substrate, and
wherein the second low-concentration doping portion is formed at the back surface of the semiconductor substrate after the first low-concentration doping portion of the back surface of the semiconductor substrate is removed,
wherein the second high-concentration doping portion is formed at the second low concentration doping portion of the black surface of the semiconductor substrate,
wherein the forming of the high-concentration doping portion comprises forming a first region having a first resistance, and a second region having a higher resistance than the first resistance,
each of depths of the first region, the second region and low-concentration doping portion is uniform,
the second region is located between the first region and low-concentration doping portion, and
low-concentration doping portion is located between adjacent the second regions.

2. The method according to claim 1, wherein the forming the high-concentration doping portion comprises irradiating the glass composition layer with a laser beam.

3. The method according to claim 2, wherein the laser beam, which irradiate the first region and the second region during the formation of the high-concentration doping portion, respectively, have different power level.

4. The method according to claim 2, wherein the forming the high-concentration doping portion is performed such that the second region is formed at an outside of the first region after formation of the first region, or the first region is formed after formation of the second region.

5. The method according to claim 2, wherein the second region comprises regions respectively arranged at opposite sides of the first region.

6. The method according to claim 1, further comprising:
removing the glass composition layer after the formation of the high-concentration doping portion.

7. The method according to claim 1, wherein the glass composition layer comprises phosphorous silicate glass (PSG) or boron silicate glass (BSG).

8. The method according to claim 6, further comprising:
forming an insulating layer over the impurity layer after the removal of the glass composition layer;
coating an electrode composition layer over the insulating layer;
subjecting the electrode composition layer to a heat treatment; and
subjecting the heat-treated electrode composition layer to a fire-through process, thereby forming an electrode electrically connected to the impurity layer,
wherein at least a portion of the electrode contacts the first region.

9. The method according to claim 1, wherein the impurity layer comprises an emitter layer having a conductivity type different from a conductivity type of the semiconductor substrate.

10. The method according to claim 1, wherein the impurity layer comprises a back surface field layer having a same conductivity type as a conductivity type of the semiconductor substrate.

* * * * *